(12) United States Patent
Takahashi et al.

(10) Patent No.: US 7,067,347 B2
(45) Date of Patent: Jun. 27, 2006

(54) METHOD OF MANUFACTURING OPTICAL SEMICONDUCTOR INTEGRATED CIRCUIT DEVICE

(75) Inventors: Tsuyoshi Takahashi, Gunma (JP); Katsuya Okabe, Gunma (JP); Akira Hatsugai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 78 days.

(21) Appl. No.: 10/948,740

(22) Filed: Sep. 24, 2004

(65) Prior Publication Data

US 2005/0118815 A1    Jun. 2, 2005

(30) Foreign Application Priority Data

Sep. 29, 2003    (JP)    ............................. 2003-338857

(51) Int. Cl.
*H01L 21/00*    (2006.01)

(52) U.S. Cl. ............................. 438/64; 438/65; 257/48

(58) Field of Classification Search ..................... None
See application file for complete search history.

(56) References Cited

U.S. PATENT DOCUMENTS 5,917,981 A * 6/1999 Kovacic et al. ............. 385/131
6,555,410 B1 * 4/2003 Tsang ............................. 438/69
2003/0168658 A1 * 9/2003 Fukushima et al. ............ 257/48

FOREIGN PATENT DOCUMENTS

JP    2001-320078    11/2001

* cited by examiner

*Primary Examiner*—Duy-Vu N. Deo
(74) *Attorney, Agent, or Firm*—Morrison & Foerster, LLP

(57) ABSTRACT

In an existing optical semiconductor integrated circuit device, a silicon nitride film that is an anti-reflection film is used as an etching stopper film at the etching of an insulating film and by means of wet etching the insulating film is removed once for all. Accordingly, there is a problem in that the processing accuracy is poor. In an optical semiconductor integrated circuit device according to the present invention, after a multi-layered wiring layer is formed on a top surface of a silicon substrate, an insulating layer on a top surface of an anti-reflection film of a photodiode is removed by means of dry etching. At this time, a polycrystal silicon film is used as an etching stopper film. Thereby, in the photodiode according to the invention, although the dry etching is used, since a silicon nitride film that is an anti-reflection film is not over-etched, the dispersion of film thickness thereof can be inhibited from occurring. As a result, a photodiode according to the present invention can realize an improvement in the sensitivity of incident light and a miniaturization structure can be realized.

3 Claims, 9 Drawing Sheets

METHOD OF MANUFACTURING OPTICAL SEMICONDUCTOR INTEGRATED CIRCUIT DEVICE

BACKGROUND OF THE INVENTION

1. Field of the Invention

The present invention relates to a method of manufacturing an optical semiconductor integrated circuit device having a photodiode and intends to eliminate variation of thickness of insulating film laminated on the photodiode and thereby to improve the sensitivity of the photodiode.

2. Description of the Related Art

In a photodiode for blue laser, a transparent package absorbs energy of incident light to cause the burning of the package. Accordingly, for an IC package, a hollow package has to be adopted. As a result, an insulating film on a photodiode formation region is exposed to air in the hollow package. The reflection of incident light at a surface of the insulating film depends on a thickness of the insulating film. That is, a problem is known in that the sensitivity of the photodiode fluctuates as the film thickness of the insulating film fluctuates.

In this connection, as a countermeasure against the fluctuation of the sensitivity due to the fluctuation of the film thickness of the insulating film, there is a technique in which on the photodiode formation region as a surface protective film a single layer of a silicon nitride film is covered (Patent Reference 1).

[Patent Reference 1] JP-A-2001-320078

In the invention according to patent reference 1, the abovementioned silicon nitride film is used, when an insulating film is etched, as an etching stopper film, and, according to wet etching, the insulating film is removed once for all. Accordingly, when the insulating film is removed by etching, since the etching proceeds in a horizontal direction to a surface of the substrate, there are problems in that a desired structure can be obtained with difficulty and the processing accuracy is poor.

SUMMARY OF THE INVENTION

The present invention is achieved in view of the abovementioned various situations.

A method of manufacturing an optical semiconductor integrated circuit device according to the present invention includes preparing a semiconductor substrate, forming a semiconductor layer on the semiconductor substrate and forming a photodiode on the semiconductor layer; after a silicon nitride film is formed on a surface of the semiconductor layer in a formation region of the photodiode, forming a silicon oxide film on the silicon nitride film; forming a polycrystal silicon film on the silicon oxide film; laminating an insulating layer on a top surface of the polycrystal silicon film; removing from a surface of the insulating layer by means of dry etching the insulating layer in the photodiode formation region; and removing the silicon oxide film and the polycrystal silicon film and thereby exposing the silicon nitride film. Accordingly, in a method of manufacturing an optical semiconductor integrated circuit device according to the invention, when an insulating layer formed on a photodiode formation region is removed by the dry etching method, the insulating layer is removed. Thereby, the processing accuracy by the etching can be improved and a miniaturization process can be realized.

In the method of manufacturing an optical semiconductor integrated circuit device according to the invention, in the step of removing the insulating layer, with the polycrystal silicon film as an etching stopper film, the insulating layer is removed by means of dry etching. Accordingly, in the method of manufacturing an optical semiconductor integrated circuit device according to the invention, when an insulating layer formed on a photodiode formation region is removed, a polycrystal silicon film is used as an etching stopper film. Thereby, in the present invention, according to the dry etching, an insulating layer on a photodiode formation region can be removed.

In the method of manufacturing an optical semiconductor integrated circuit device according to the invention, in the step of removing the polycrystal silicon film, with the silicon oxide film as an etching stopper film, the polycrystal silicon film is removed by means of dry etching, and in the process of removing the silicon oxide film, with the silicon nitride film as an etching stopper film, the silicon oxide film is removed by means of wet etching. Accordingly, in the method of manufacturing an optical semiconductor integrated circuit device according to the invention, a polycrystal silicon film is removed by means of dry etching. A silicon oxide film is removed by means of wet etching. Thereby, on a top surface of a photodiode, only a silicon nitride film as an antireflection film can be disposed.

In the method of manufacturing an optical semiconductor integrated circuit device according to the invention, when an insulating layer formed on a top surface of an antireflection film of a photodiode is removed, the dry etching process can be used to remove. That is, in the invention, a polycrystal silicon film on a top surface of a silicon nitride film is used as an etching stopper film in the dry etching process, thereby the processing accuracy of an element can be improved and a miniaturization process can be realized.

In the method of manufacturing an optical semiconductor integrated circuit device according to the invention, a silicon oxide film is formed on a top surface of a silicon nitride film that is an antireflection film of a photodiode and on the silicon oxide film a polycrystal silicon film is formed. When an insulating layer is dry etched, the polycrystal silicon film is used as an etching stopper film. Furthermore, when the polycrystal silicon film is dry etched, the silicon oxide film is used as an etching stopper film. Thus, in the photodiode according to the invention, dry etching is used. Since the silicon nitride film that is an antireflection film is not over-etched, the fluctuation of the thickness thereof can be inhibited from occurring. As a result, in a photodiode according to the invention, an improvement in the sensitivity to incident light can be realized and the miniaturization structure can be realized.

DESCRIPTION OF THE PREFERRED EMBODIMENTS

In what follows, a method of manufacturing an optical semiconductor integrated circuit device according to an embodiment of the invention will be detailed with reference to FIGS. 1 through 11.

Figure 1:
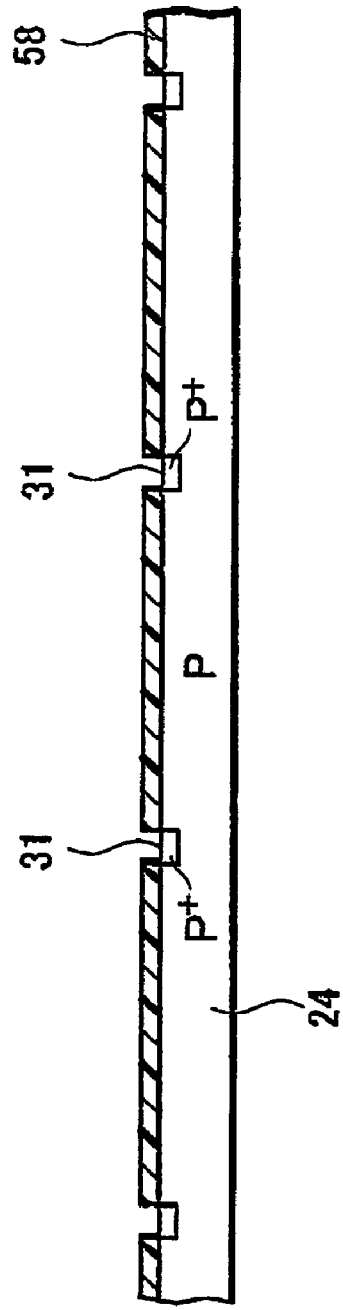
FIG. 1 is a sectional view for explaining a method of manufacturing an optical semiconductor integrated circuit device according to an embodiment of the present invention.

Firstly, as shown in FIG. 1, in a p-type single crystal silicon substrate 24, with a photoresist 58 as a mask, boron (B) is injected. Then, in $N_2$ gas, heat treatment at substantially 1180 degree centigrade is applied for substantially 4 hrs. According to the heat treatment, on a surface of the p-type single crystal silicon substrate 24, boron (B) is diffused to form a first isolation region 31.

Figure 2:
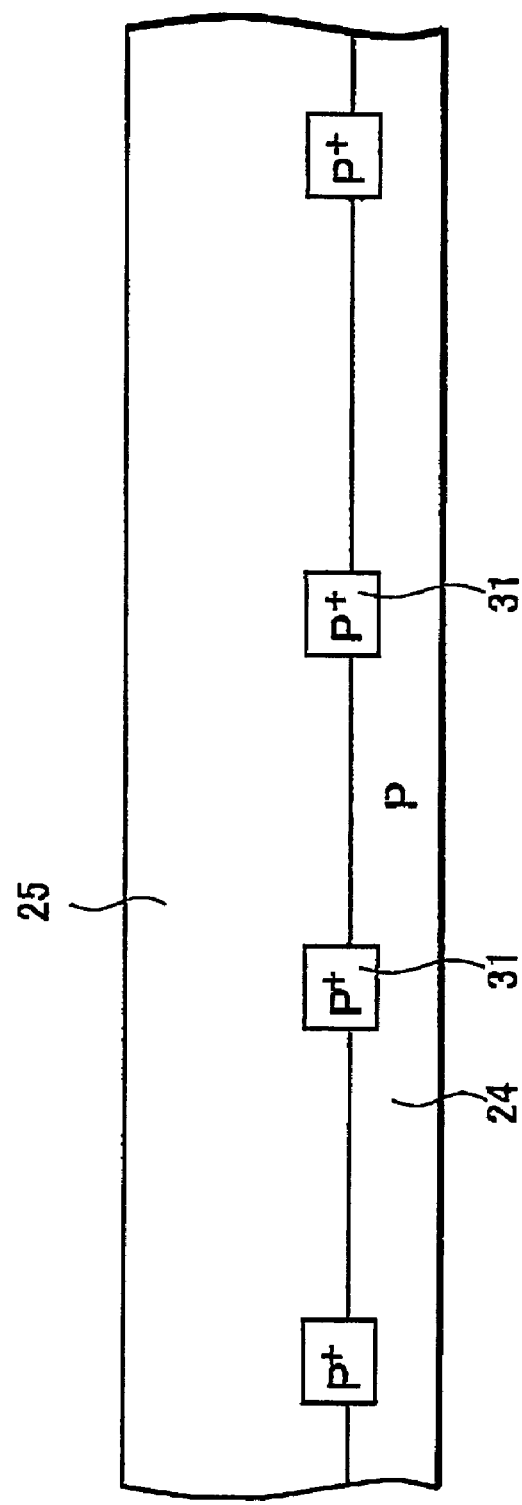
FIG. 2 is a sectional view for explaining a method of manufacturing an optical semiconductor integrated circuit device according to an embodiment of the present invention.

Subsequently, as shown in FIG. 2, on the p-type single crystal silicon substrate 24, a non-doped first epitaxial layer 25 is formed with the resistivity of 100 Ω·cm or more and a thickness of 15 μm.

Figure 3:
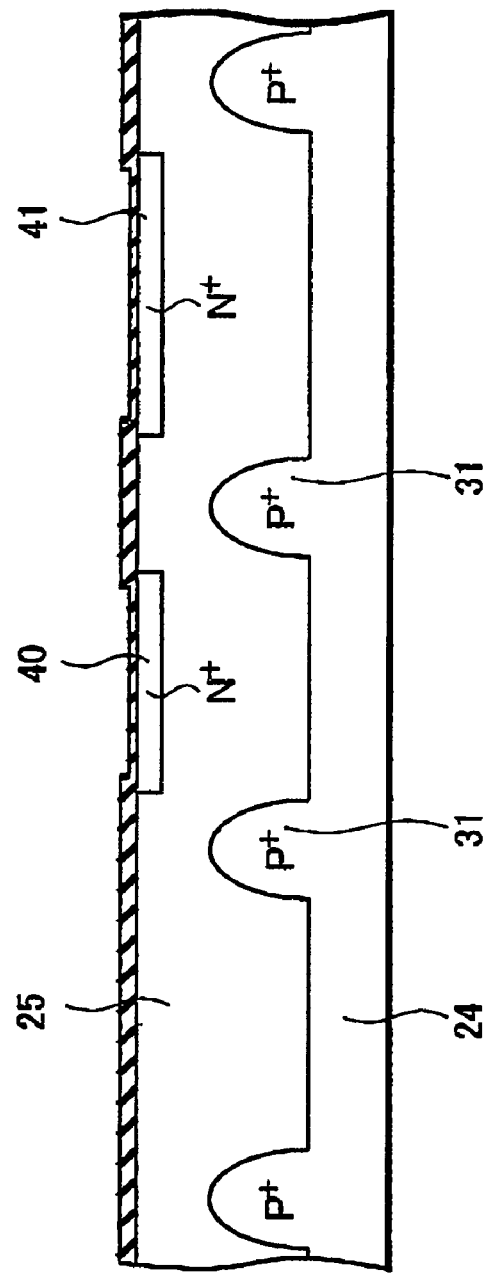
FIG. 3 is a sectional view for explaining a method of manufacturing an optical semiconductor integrated circuit device according to an embodiment of the present invention.

In the next place, as shown in FIG. 3, a surface of the first epitaxial layer 25 is thermally oxidized at substantially 1100 degree centigrade to grow a silicon oxide film of substantially 6700 Å and thereby to form a selection mask. Subsequently, antimony is diffused to form an N+ type buried layer 41 of an NPN transistor and an N+ type buried layer 40 of a capacitor element.

Figure 4:
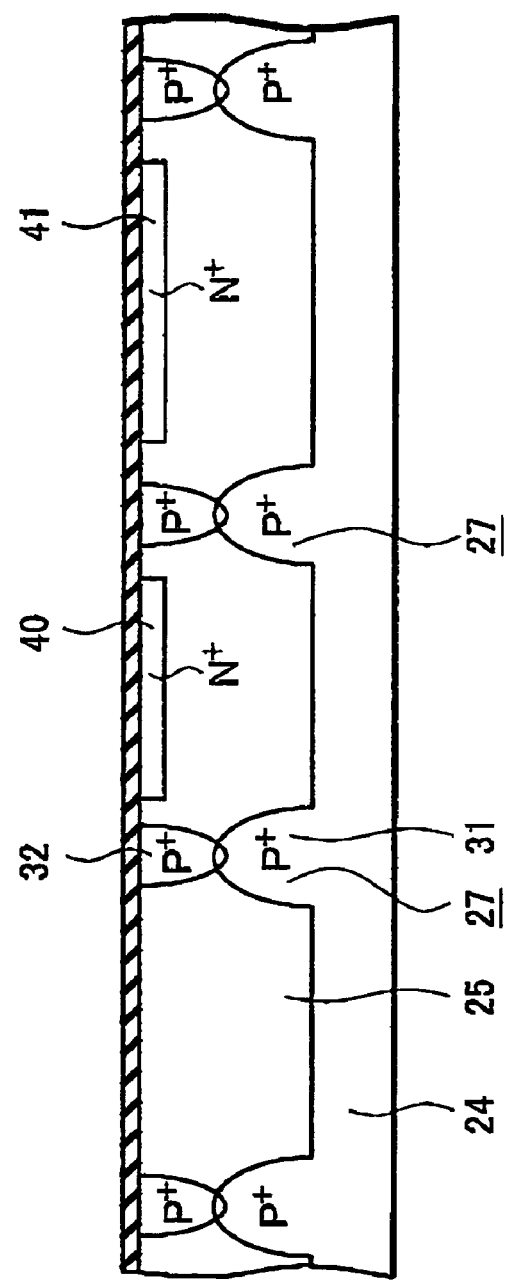
FIG. 4 is a sectional view for explaining a method of manufacturing an optical semiconductor integrated circuit device according to an embodiment of the present invention.

Subsequently, as shown in FIG. 4, the silicon oxide film that was used as a selection mask is removed with an HF based etchant. Thereafter, boron (B) is ion implanted with a photoresist as a mask to form a second isolation region 32. Then, over an entirety of the P-type single crystal silicon substrate 24, heat treatment is applied in $N_2$ gas at substantially 1180 degree centigrade for substantially 4 hrs. According to the heat treatment, the first and second isolation regions 31 and 32 are diffused and thereby an isolation region 27 that links both isolation regions is formed.

Figure 5:
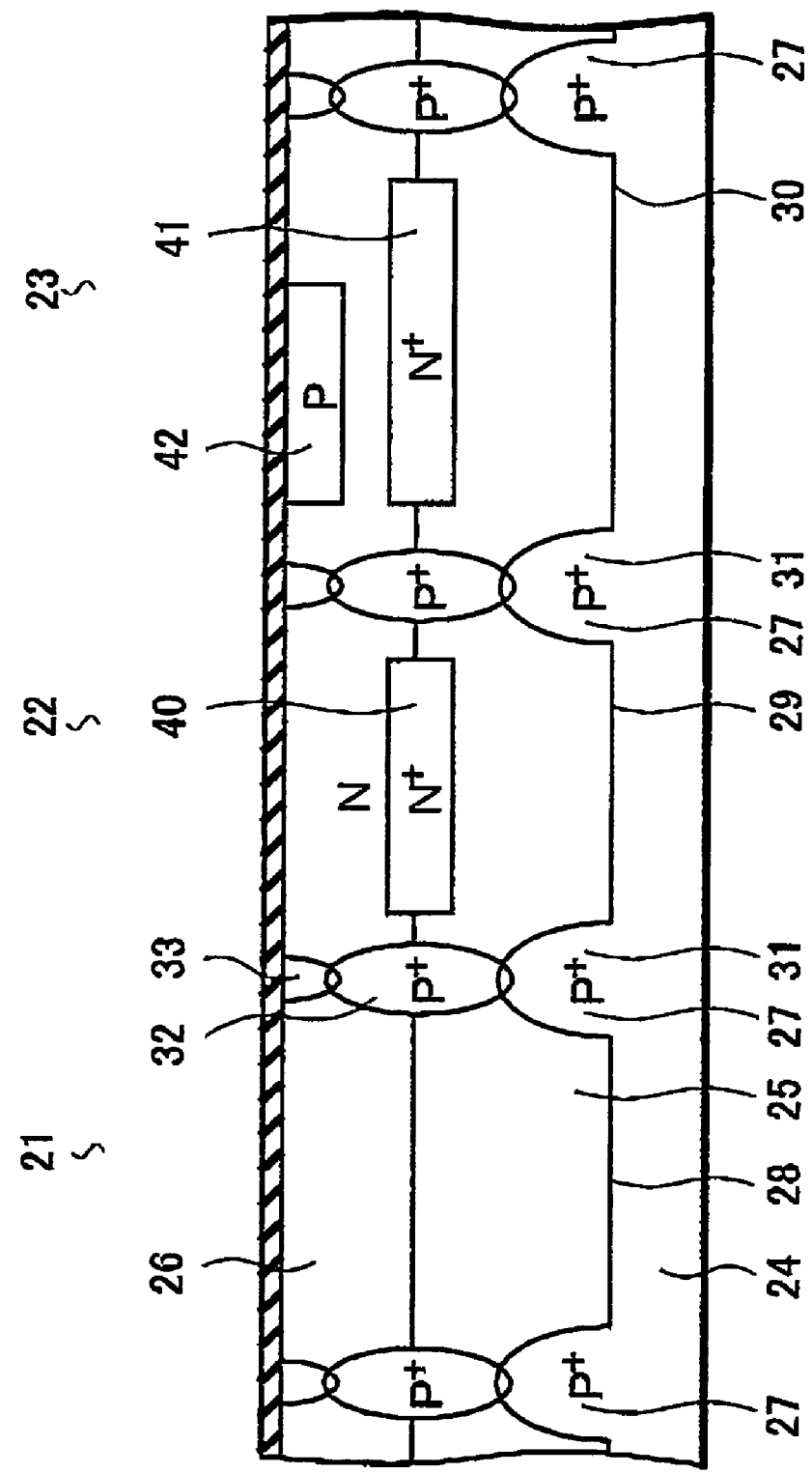
FIG. 5 is a sectional view for explaining a method of manufacturing an optical semiconductor integrated circuit device according to an embodiment of the present invention.

In the next place, as shown in FIG. 5, on the first epitaxial layer 25, a phosphorus-doped second epitaxial layer 26 having the resistivity of 1.2 Ω·cm and a film thickness of 7 μm is formed. Then, a surface of the second epitaxial layer 26 is thermally oxidized. Thereafter, in $N_2$ gas, heat treatment is applied at substantially 1180 degree centigrade for substantially 2 hrs to diffuse the isolation regions once more owing to the heat treatment, the second isolation region 32 is diffused toward a surface of silicon; accordingly, a third isolation region 33 can be shallowly diffused. Accordingly, since the third isolation region 33 can be inhibited from diffusing in a horizontal direction, a surface occupation area of the third isolation region 33 can be reduced. As a result, an integration degree can be improved. Then, the silicon oxide film is removed by photoetching to form a selection mask. Thereafter, boron (B) that forms the third isolation region 33 is diffused. The P+ type isolation region 27 that completely penetrates through the first and second epitaxial layers 25 and 26 electrically, separates both layers into a first island region 28 that forms a photodiode 21, a second island region 29 that forms a capacitor element 22 and a third island region 30 that forms an NPN transistor 23. Subsequently, ion injection is carried out, heat treatment in $N_2$ gas at substantially 1100 degree centigrade is applied for substantially 1 hr to diffuse and thereby a base region 42 of the NPN transistor is formed.

Figure 6:
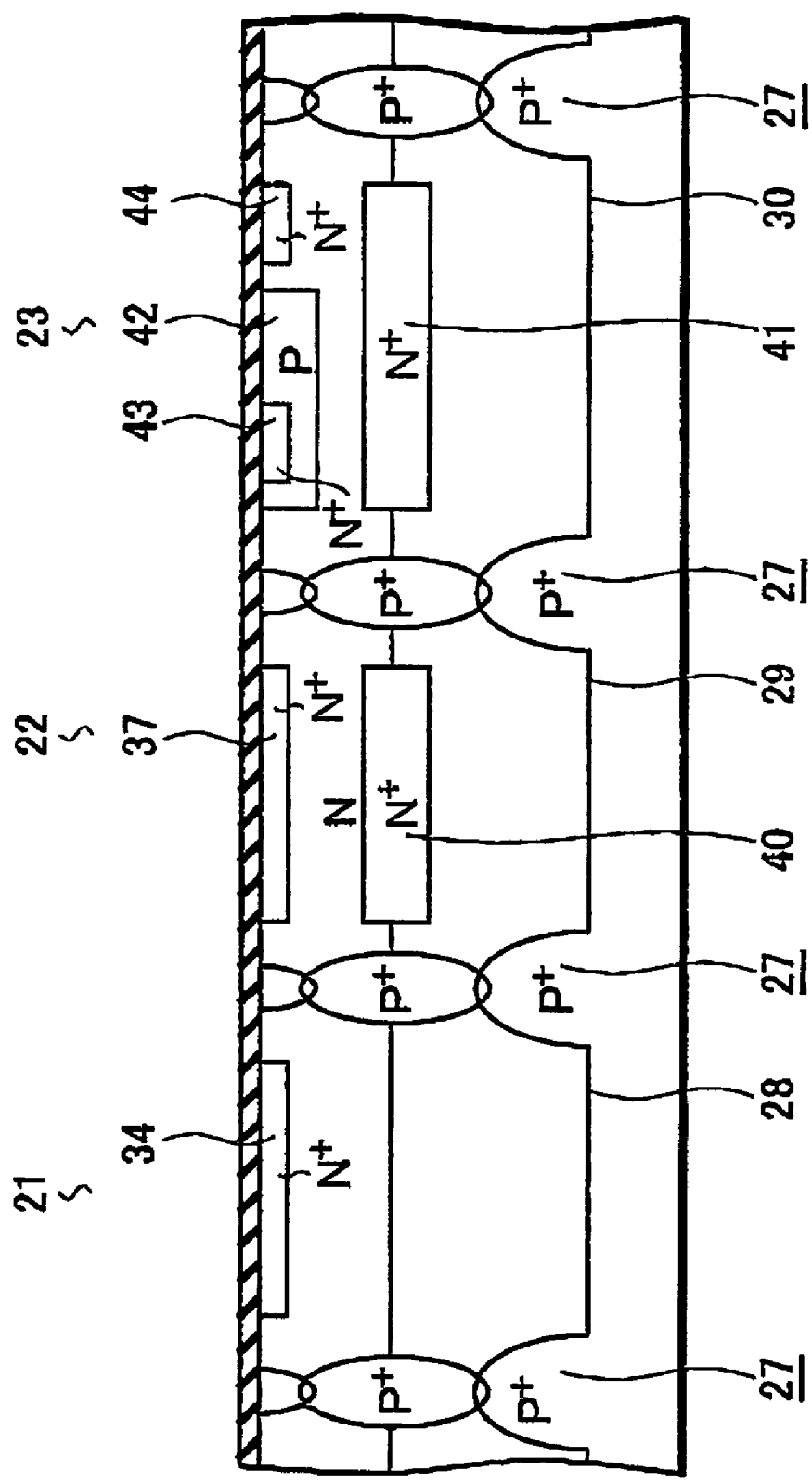
FIG. 6 is a sectional view for explaining a method of manufacturing an optical semiconductor integrated circuit device according to an embodiment of the present invention.

Subsequently, as shown in FIG. 6, ion injection of phosphorus (P) is applied, followed by heat-treating in $N_2$ gas at substantially 900 degree centigrade for substantially 40 min to diffuse, and thereby an emitter region 43 and a collector contact region 44 of the NPN transistor are formed. Simultaneously, a lower electrode region 37 of a capacitor element and an N+ type diffusion region 34 of a photodiode are formed.

Figure 7:
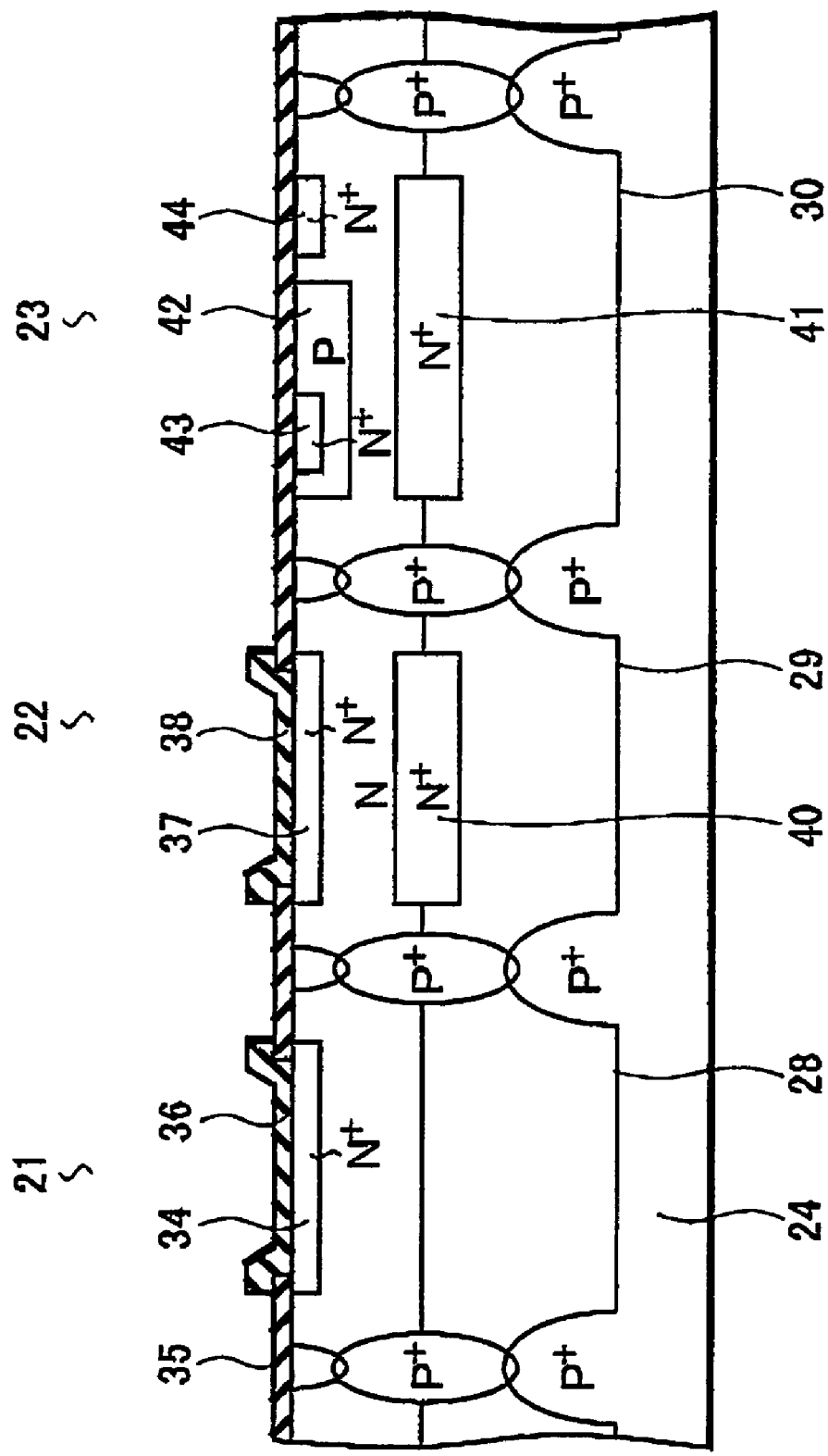
FIG. 7 is a sectional view for explaining a method of manufacturing an optical semiconductor integrated circuit device according to an embodiment of the present invention.

In the next place, as shown in FIG. 7, a silicon oxide film 35 on the N+ type diffusion region 34 and the lower electrode region 37 is removed. Subsequently, by means of a CVD method, a silicon nitride film having a film thickness of substantially 900 Å is deposited and partially removed by photoetching. Thereby, an anti-reflection film of the photodiode and a dielectric film 38 of the capacitor element are formed.

Figure 8:
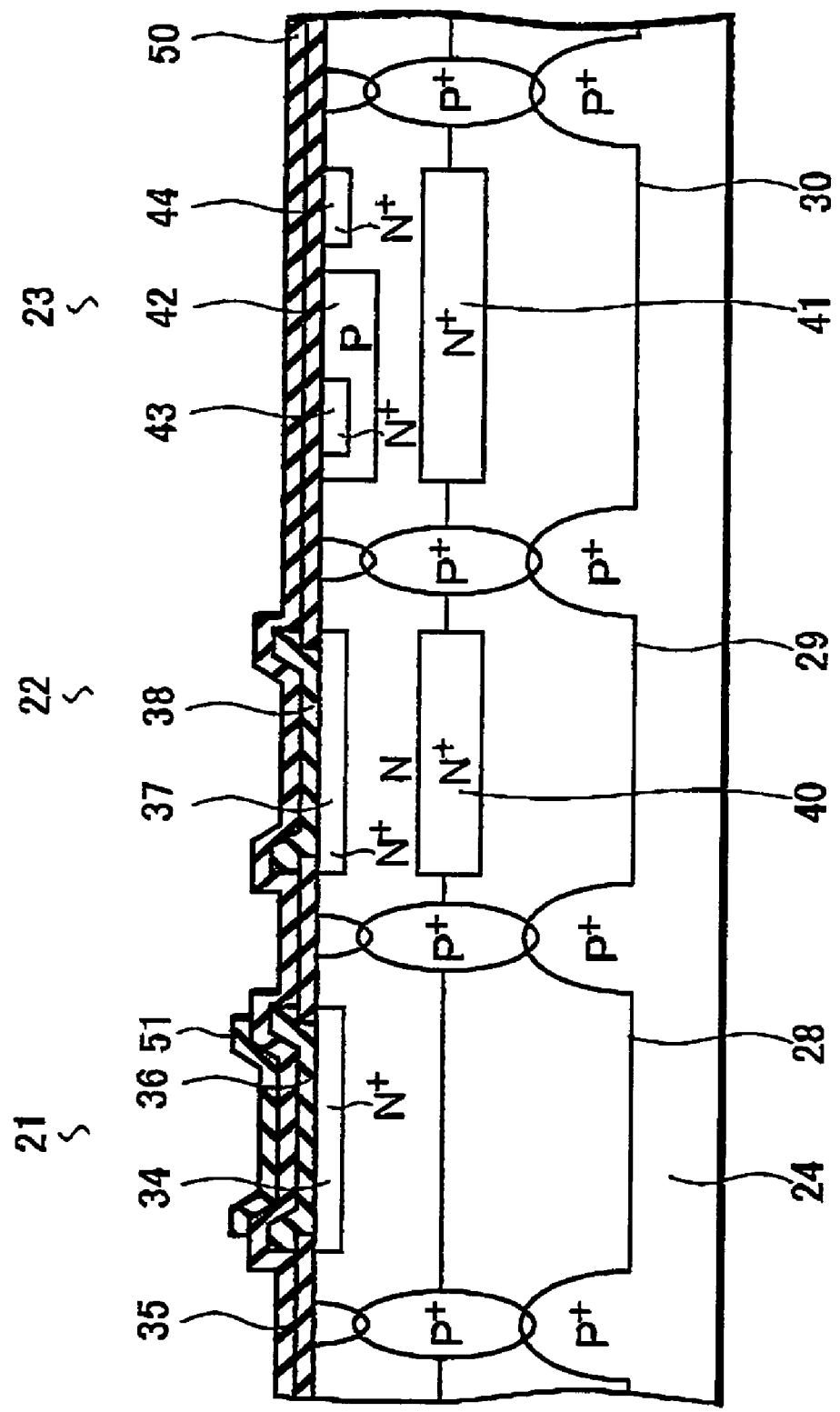
FIG. 8 is a sectional view for explaining a method of manufacturing an optical semiconductor integrated circuit device according to an embodiment of the present invention.

Then, as shown in FIG. 8, by means of a CVD method, a non-doped silicon oxide film 50 is deposited with a film thickness of substantially 500 to 1200 Å. Thereafter, a polycrystal silicon film 51 is deposited by substantially 2000 Å. Subsequently, the polycrystal silicon film 51 in a region other than a photodiode portion is removed by photoetching. At this time, the dry etching with $CF_4+O_2$ base gas is adopted.

Figure 9:
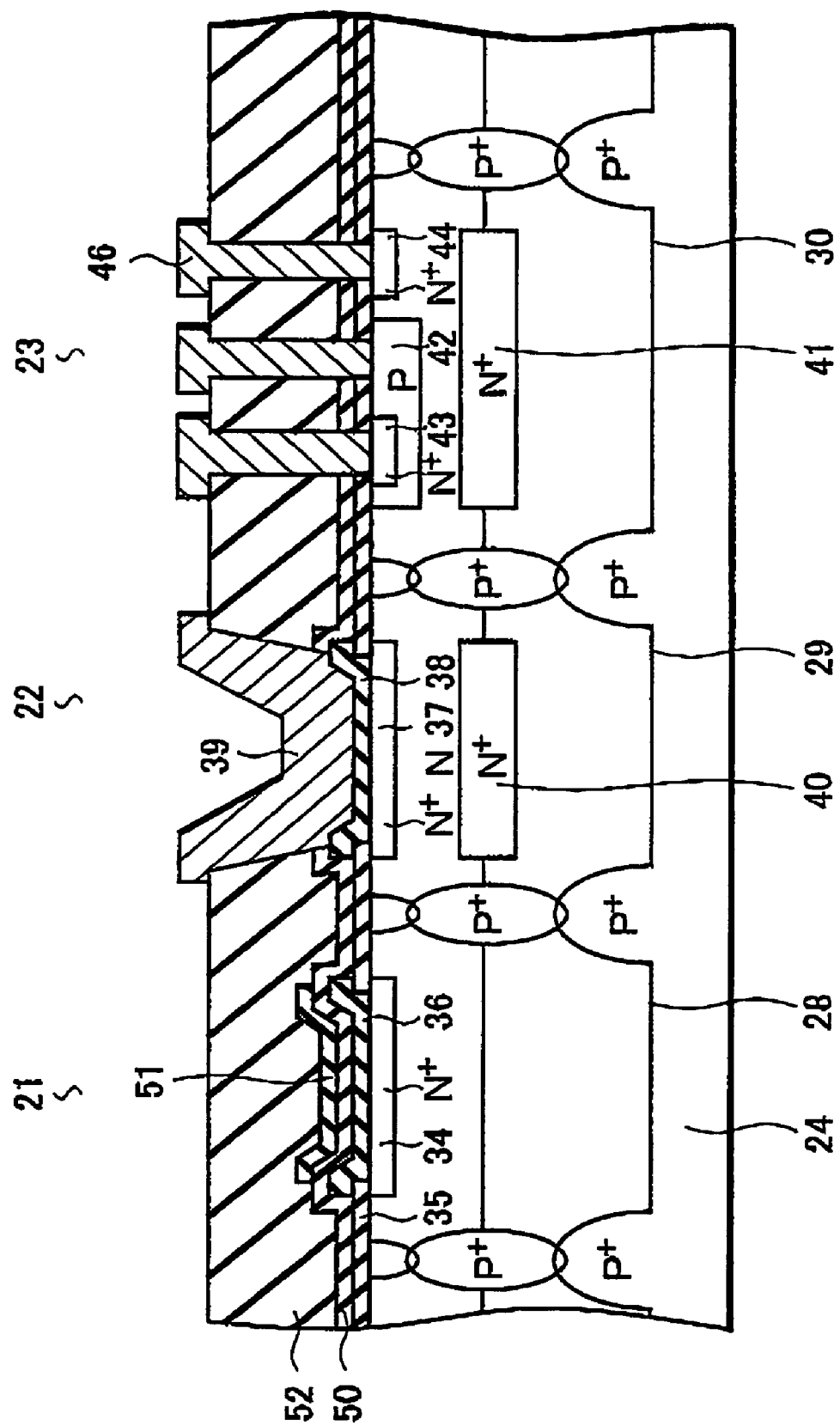
FIG. 9 is a sectional view for explaining a method of manufacturing an optical semiconductor integrated circuit device according to an embodiment of the present invention.

In the next place, as shown in FIG. 9, a silicon oxide film 52 is deposited with a thickness of substantially 6000 to 10000 Å.

Subsequently, in order to form an opening for an upper electrode of a capacitor element 22, the non-doped silicon oxide films 50 and 52 on the capacitor element 22 are removed by photoetching. At this time, the wet etching with an HF base etchant is adopted. Thereafter, a contact hole is opened. In the embodiment, the contact hole is formed for taking out an electrode of the NPN transistor 23. Furthermore, though not shown in the drawing, the contact hole is formed also for taking out an electrode of the capacitor element 22 or the photodiode 21. In the etching for forming a contact hole, firstly, the wet etching with an HF base etchant is carried out to open the contact hole halfway. Thereafter, the dry etching is applied to completely open the contact hole. An object of applying the wet etching halfway is to enlarge an upper end of the contact hole by means of side etching. As a result, a step coverage of Al deposited in a post-process can be improved and thereby the disconnection of Al can be inhibited from occurring.

Thereafter, an Al—Si alloy is deposited by substantially 1.2 μm and partially removed by photoetching, and thereby a first Al layer is formed. At this time, the etching is carried out according to dry etching. With the Al layer in the first layer, on the capacitor element 22, a capacitor element upper electrode 39 is formed. Simultaneously, on the NPN transistor 23, an electrode 46 is formed.

Figure 10:
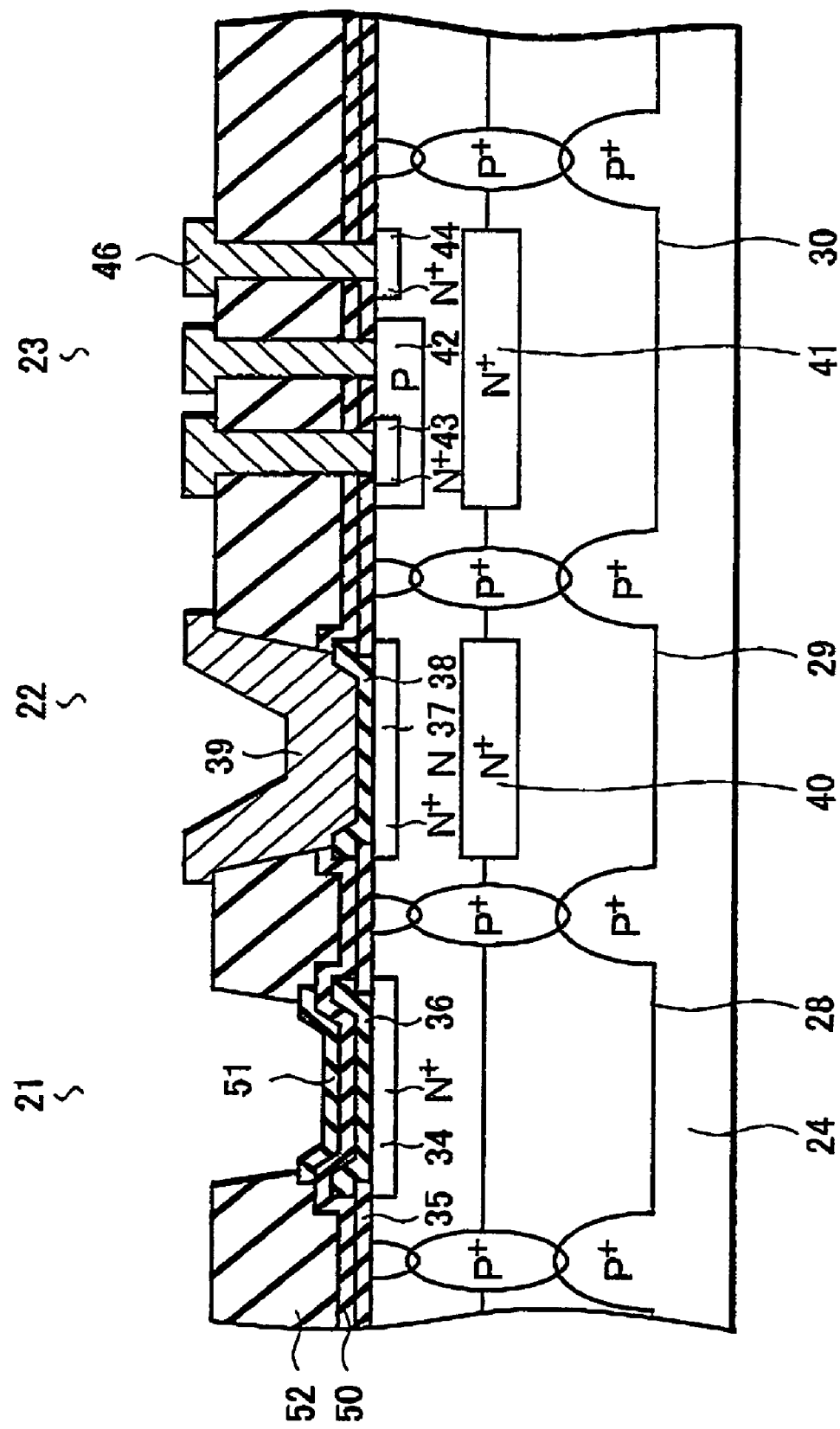
FIG. 10 is a sectional view for explaining a method of manufacturing an optical semiconductor integrated circuit device according to an embodiment of the present invention.

Then, as shown in FIG. 10, the silicon oxide film 52 on the photodiode 21 is removed by photoetching. At this time, for the etching, the dry etching with a $CHF_3+O_2$ base gas is adopted. During etching, the polycrystal silicon film 51 is used as an etching stopper film. Accordingly, the gas is selected so that a selection ratio of the silicon oxide film 52 to the polycrystal silicon film 51 may be in the range of substantially 10 to 20. The polycrystal silicon film 51 is used as an etching stopper film. Thereby, the silicon nitride film 36 that is an anti-reflection film can be inhibited from being ground by over-etching and thereby a film thickness can be inhibited from fluctuating.

Figure 11:
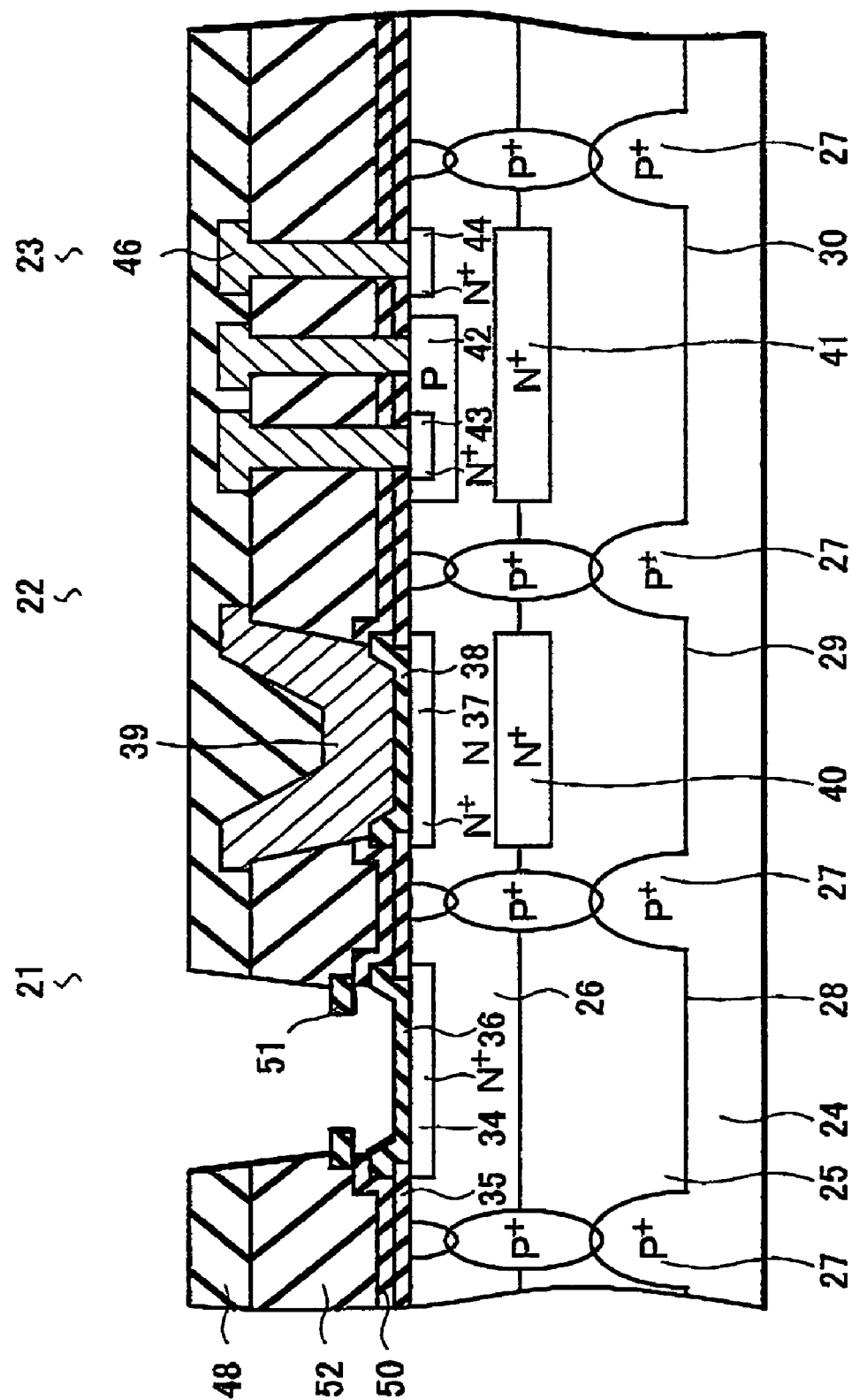
FIG. 11 is a sectional view for explaining a method of manufacturing an optical semiconductor integrated circuit device according to an embodiment of the present invention.

In the next place, as shown in FIG. 11, the polycrystal silicon film 51 on the photodiode 21 is removed by photoetching. At this time, for the etching, the dry etching process with a $CF_4+O_2$ base gas is adopted. During etching, the silicon oxide film 50 is used as an etching stopper film. Accordingly, the gas is selected so that a selection ratio of the polycrystal silicon film 51 to the silicon oxide film 50 may be in the range of substantially 15 to 25.

Subsequently, the silicon oxide film 50 on the photodiode 21 is removed by photoetching. At this time, for the etching, the wet etching with an HF base etchant is adopted. During etching, the silicon nitride film 36 is used as an etching stopper film. Accordingly, the etchant is selected so that a selection ratio of the silicon oxide film 50 to the silicon nitride film 36 may be 10, preferably substantially 20. Since after etching the silicon oxide film 50 is removed substantially 1200 Å on one side by side etching, the polycrystal silicon film 51 thereon is formed with that length overhung in a horizontal direction; however, there is no problem from a viewpoint of a device. Then, a passivation film 48 is formed and thereby a structure of an optical semiconductor device is obtained.

In the next place, a structure and operation of the photodiode 21 will be explained. Firstly, as to the structure, as mentioned above, the first epitaxial layer 25 is formed non-doped and the second epitaxial layer 26 is formed doped with phosphorus. In the structure, the N+ type diffusion region 34 is used as a cathode region. The P type single crystal silicon substrate 24 is used as an anode region.

Furthermore, in the embodiment, on a surface of the N+ type diffusion region 34, the silicon nitride film 36 that is an anti-reflection film is formed. On a portion where the silicon nitride film 36 of the N+ type isolation region 34 is partially removed, a cathode electrode (not shown in the drawing) is disposed and on a surface of the isolation region 27 an anode electrode (not shown in the drawing) is disposed.

In the next place, an operation of the photodiode 21 will be shown below. The photodiode 21 is operated in the reverse bias state with a Vcc potential such as +5V applied to a cathode electrode and with a GND potential applied to an anode electrode. When such a reverse bias state is given, depleted layers expand in the first and second epitaxial layers 25, 26 of the photodiode 21. Since the first epitaxial layer 25 is a high resistivity layer, in particular, in the first epitaxial layer 25, the depleted layer expands larger. Since the depleted layer easily expands until it reaches the P type single crystal silicon substrate 24, a very thick depleted layer can be obtained. Accordingly, a junction capacitance of the photodiode 21 can be reduced and thereby high-speed response can be realized.

What is claimed is:

1. A method of manufacturing an optical semiconductor integrated circuit device comprising:

preparing a semiconductor substrate, forming a semiconductor layer on the semiconductor substrate and forming a photodiode on the semiconductor layer;

after a silicon nitride film is formed on a surface of the semiconductor layer in a formation region of the photodiode, forming a silicon oxide film on the silicon nitride film;

forming a polycrystal silicon film on the silicon oxide film;

laminating an insulating layer on a top surface of the polycrystal silicon film;

removing, from a surface of the insulating layer, by means of dry etching, the insulating layer in the photodiode formation region; and removing the silicon oxide film and the polycrystal silicon film and thereby exposing the silicon nitride film.

2. The method of manufacturing an optical semiconductor integrated circuit device according to claim 1, wherein when removing the insulating layer, with the polycrystal silicon film as an etching stopper film, the insulating layer is removed by means of the dry etching.

3. The method of manufacturing an optical semiconductor integrated circuit device according to claim 2, wherein, when removing the polycrystal silicon film, with the silicon oxide film as an etching stopper film, the polycrystal silicon film is removed by means of the dry etching; and when removing the silicon oxide film, with the silicon nitride film as an etching stopper film, the silicon oxide film is removed by means of wet etching.

* * * * *